United States Patent [19]

Kimura

[11] Patent Number: 5,192,883
[45] Date of Patent: Mar. 9, 1993

[54] INTERFACE CIRCUIT FOR SEMICONDUCTOR MEMORY DEVICE

[75] Inventor: Masatoshi Kimura, Itami, Japan

[73] Assignee: Mitsubishi Denki Kabushiki Kaisha, Tokyo, Japan

[21] Appl. No.: 744,749

[22] Filed: Aug. 14, 1991

[30] Foreign Application Priority Data

Aug. 30, 1990 [JP] Japan ................................ 2-231123

[51] Int. Cl.$^5$ ........................................ H03K 19/0175
[52] U.S. Cl. ..................................... 307/475; 307/140; 307/126
[58] Field of Search ................ 307/475, 140, 126, 130

[56] References Cited

U.S. PATENT DOCUMENTS

| | | | |
|---|---|---|---|
| 4,300,213 | 11/1981 | Tanimura | 307/475 |
| 4,682,052 | 7/1987 | Kyomasu | 307/475 |
| 4,763,303 | 8/1988 | Flannagan | 307/475 |
| 4,882,506 | 11/1989 | Johansson | 307/475 |

FOREIGN PATENT DOCUMENTS 63-240615  6/1988  Japan.
3-154914   2/1991  Japan.

*Primary Examiner*—Paul M. Dzierzynski
*Assistant Examiner*—R. A. Ratliff
*Attorney, Agent, or Firm*—Lowe, Price, LeBlanc & Becker

[57] ABSTRACT

Disclosure herein is an interface circuit for a semiconductor memory device, which is so structured that, when a control signal (VBC) is supplied to a control signal input end, a transistor (2) first enters a conducting state to supply a supply voltage to a semiconductor memory device (1) and thereafter bus control means (7, 8) is brought into a conducting state by a control signal delayed by a delay circuit (22), to supply bus signals (ADD', CTD' and DTS') to the semiconductor memory device.

9 Claims, 6 Drawing Sheets

INTERFACE CIRCUIT FOR SEMICONDUCTOR MEMORY DEVICE

BACKGROUND OF THE INVENTION

1. Field of the Invention

The present invention relates to an interface circuit for a semiconductor memory device such as a memory card, a memory pack or the like, and more particularly, it relates to technique of optimizing the control procedure of power supply and bus signals for such a semiconductor memory device.

2. Description of the Background Art

A memory card serving as a semiconductor memory device is widely applied to a small word processor, a lap-top personal computer or the like as a high-speed small recording medium of a detachable type.

FIG. 5 is a circuit diagram showing the structure of a conventional interface circuit for a semiconductor memory device. Referring to FIG. 5, a semiconductor memory device 101 such as a DRAM, SRAM, EEPROM or the like is detachably connected with a terminal device 150 through a power supply terminal $V_{CC}$, an address terminal $T_A$, a control terminal $T_C$ and a data input/output terminal $T_D$. The terminal device 150 comprises a CPU (not shown) and an interface circuit 151 for the CPU and the semiconductor memory device 101. A supply voltage $V_C$ is inputted in a power input line 111 of the interface circuit 151 from a power supply (not shown). The power input line 111 is connected to an emitter of a transistor 102, which is adapted to connect/cut off the supply voltage $V_C$, as well as to a base of the transistor 102 through a bleeder resistor 103. The bleeder resistor 103 is adapted to raise up the base potential of the transistor 102 to the supply voltage $V_C$. A control signal line 118, which receives a power supply/bus control signal VBC for controlling the power supply and buses, is connected to an input terminal of an inverter 106. This control signal line 118 is further connected to a gate terminal G of a three-state unidirectional buffer (hereinafter simply referred to as "buffer") 107 and a gate terminal G of a three-state bidirectional buffer (hereinafter simply referred to as "buffer") 108. An output terminal of the inverter 106 is connected to the base of the transistor 102 through a base resistor 104. The base resistor 104 is adapted to control the base current of the transistor 102. The collector of the transistor 102 is connected to the power supply terminal $V_{CC}$ of the semiconductor memory device 101, while an end of an input resistor 105, another end of which is grounded, is connected to an intermediate node therebetween. The input resistor 105 is adapted to determine input impedance to the semiconductor memory device 101 when the transistor 102 is cut off.

The buffer 107 is interposed in an address bus 113, which is connected to the address terminal $T_A$ of the semiconductor memory device 101, and a control bus 114, which is connected to the control terminal $T_C$ of the semiconductor memory device 101. Address data ADD are inputted in the semiconductor memory device 101 through the address bus 113, while control data CTD are inputted in the semiconductor memory device 101 through the control bus 114. The buffer 107 connects/cuts off inputs of the address data ADD and the control data CTD in response to the power supply/bus control signal VBC.

The buffer 108 is interposed in a data bus 115, which is connected to the data input/output terminal $T_D$ of the semiconductor memory device 101. A data signal DTS is inputted in or outputted from the semiconductor memory device 101 through the data bus 115. The buffer 108 connects/cuts off input/output of the data signal DTS in response to the power supply/bus control signal VBC. A direction switching signal line 116 is connected to a direction switching terminal DIR of the buffer 108. The direction switching signal line 116 is supplied with a read/write signal R/W, in order to switch the direction of movement of the data signal DTS in the buffer 108 in response to read/write operation of the semiconductor memory device 101.

Operation timing of the conventional interface circuit 151 having the aforementioned structure is now described.

FIG. 6 is an operation timing chart of the conventional interface circuit 151.

When a power supply/bus control signal VBC of a high level is applied to the control signal line 118, the gate terminals G of both buffers 107 and 108 go high so that the buffers 107 and 108 enter enable states and conduct. Due to such conduction, the address data ADD, the control data CTD and the data DTS received in the buses 113, 114 and 115 are supplied to the semiconductor memory device 101.

When such a high-level power supply/bus control signal VBC is applied to the control signal line 118, further, the output of the inverter 106 goes low. Therefore, a base current flows to the transistor 102 through the base resistor 104 to allow conduction of the transistor 102, whereby a supply voltage $V_{C'}$ is supplied to the power supply terminal $V_{CC}$.

In general, the speed and time required for connecting/cutting off the buffers 107 and 108 are higher and shorter than those required for connecting/cutting off the transistor 102. Namely, the buffers 107 and 108 conduct in advance of the transistor 102 in response to the change of the power supply/bus control signal VBC from a low level to a high level (FIG. 6(a)). Therefore, data ADD', CTD' and DTS' are supplied from the respective buses 113, 114 and 115 to the terminals $T_A$, $T_C$ and $T_D$ of the semiconductor memory device 101 in advance of the supply voltage $V_{C'}$ (FIG. 6(b) and (c)).

When a power supply/bus control signal VBC of a low level is applied to the control signal line 118, on the other hand, the gate terminals G of the buffers 107 and 108 enter disable states, whereby the buffers 107 and 108 are cut off. Further, the output of the inverter 106 goes high to cut off the transistor 102. Therefore, the data ADD, CTD and DTS and the supply voltage $V_C$ are not supplied to the terminals $V_{CC}$, $T_A$, $T_C$ and $T_D$. Since the time required for connecting/cutting off the buffers 107 and 108 is shorter than that for the transistor 102 as hereinabove described, the transistor 102 is cut off after the buffers 107 and 108 are cut off.

In such a semiconductor memory device having a semiconductor integrated circuit in its interior, it is generally desired to first input a power supply, thereafter add an input/output signal, cut off the input signal and thereafter cut off the power supply.

When data supply to the buses is stopped in the conventional interface circuit shown in FIG. 5, the supply voltage is cut off in a delay to the bus data to with no problem, since the transistor is cut off after the buffers are cut off, as hereinabove described. When the bus data are supplied to the semiconductor memory device as shown in FIG. 6, however, difference of a time $t_2$ is caused between conduction of the buses and conduction of the power supply, and hence the bus data are problematically inputted in advance of the supply voltage by the time $t_2$. When the bus data are thus precedingly inputted, a latch-up phenomenon may take place such that the semiconductor integrated circuit provided in the semiconductor memory device performs no normal storage operation, and an excess current may flow due to such a latch-up phenomenon as the case may be, to deteriorate and break the internal semiconductor integrated circuit. Thus, it is not desirable for the semiconductor memory device that the buses conduct in advance of the power supply.

SUMMARY OF THE INVENTION

An object of the present invention is to provide an interface circuit for a semiconductor memory device, which can prevent the semiconductor memory device from a latch-up phenomenon as well as deterioration/breakage by optimizing the procedure of application of power supply and bus signals, thereby safely controlling the power supply and the buses.

In order to attain the aforementioned object, the inventive interface circuit for a semiconductor memory device comprises:

a control signal input end for inputting a control signal, a power input line for supplying power to the semiconductor memory device, power supply control means for connecting/cutting off the power input line in response to the control signal, input/output buses connected to the semiconductor memory device, bus control means for connecting/cutting off the input/output buses in response to a delay control signal and which operates at a higher speed than said power control means, delay means for delaying the control signal from the input end in relation to operating speed difference between the power supply control means and the bus control means, and delay control signal supply means for supplying the control signal delayed by the delay means to the bus control means as the delay control signal.

In the aforementioned interface circuit for a semiconductor memory device, the received control signal is supplied to the power control means with no delay, so that the power is supplied to the semiconductor memory device in response to this. The control signal is delayed in relation to the operating speed difference between the power supply control means and bus control means by the delay means. The delay control signal is supplied to the bus control means, so that the buses conduct by supply of the power and the bus signal is supplied to the semiconductor memory device in a delay. Therefore, the power supply and bus signals can be supplied to the semiconductor device in such an optimum procedure. That is the bus signal is supplied to the semiconductor memory device after the power is supplied to it. Thus, it is possible to prevent the semiconductor memory device from a latch-up phenomenon as well as deterioration and breakage caused by such a latch-up phenomenon, so that the power supply and the buses for the semiconductor memory device can be controlled in safety.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
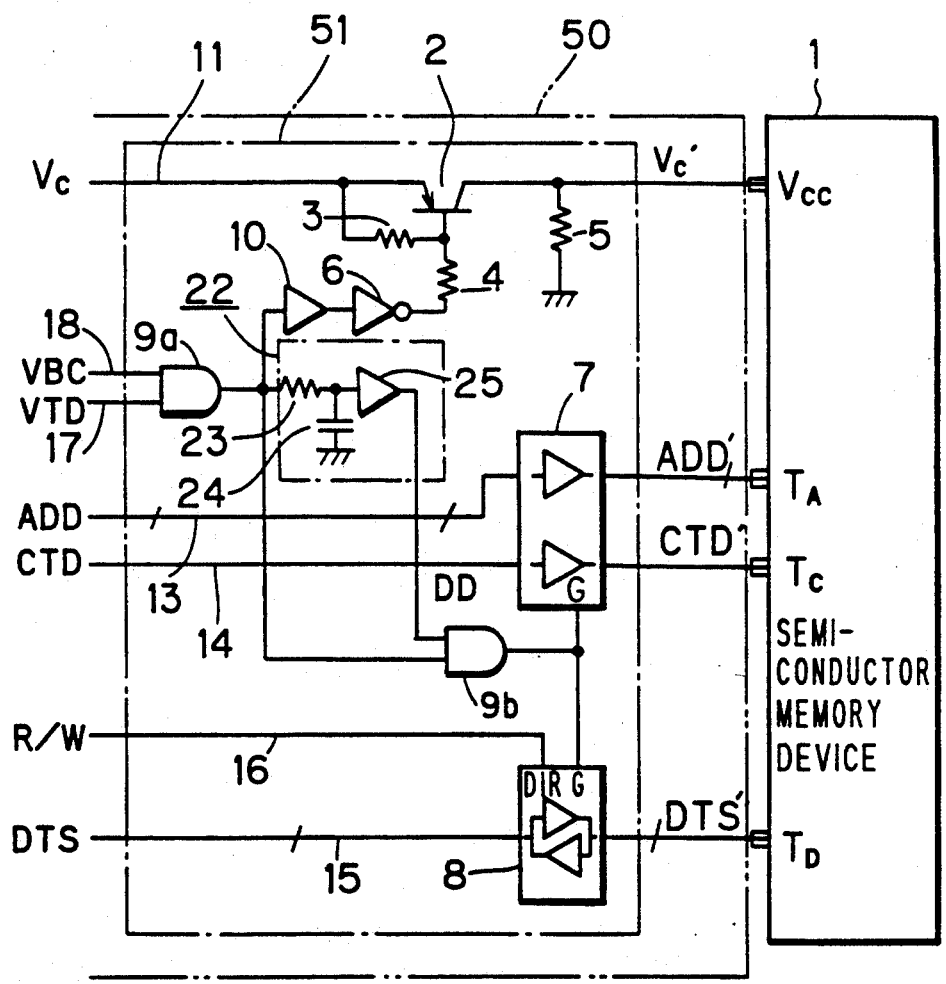
FIG. 1 is a circuit diagram showing the structure of an interface circuit for a semiconductor memory device according to the present invention.

FIG. 1 is a circuit diagram showing an interface circuit for a semiconductor device 1, such as a DRAM, SRAM, EEPROM, or the like.

The semiconductor memory device 1 is detachably connected with a terminal device 50 through a power supply terminal $V_{CC}$, an address terminal $T_A$, a control terminal $T_C$ and a data input/output terminal $T_D$. The terminal device 50 comprises a CPU (not shown) and an interface circuit 51 for the CPU and the semiconductor memory device 1. A supply voltage $V_C$ is inputted in a power input line 11 of the interface circuit 51 from a power supply (not shown). The power input line 11 is connected to an emitter of a transistor 2, as well as to a base of the transistor 2 through a bleeder resistor 3. The transistor 2 connects/cuts off the supply voltage $V_C'$. The bleeder resistor 3 is adapted to raise up the base potential of the transistor 2 to the supply voltage $V_C$. A control signal line 18, which receives a power supply/bus control signal VBC for controlling the power supply and buses, is connected to one input end of an AND circuit 9a, while an instantaneous interruption detecting signal line 17 is connected to another input end of the AND circuit 9a. The instantaneous interruption detecting signal line 17 receives a power supply instantaneous interruption detecting signal VTD, which is changed when the power supply is instantaneously interrupted. The power supply instantaneous interruption detecting signal VTD goes low when the power supply is instantaneously interrupted and the supply voltage $V_C$ is below a standard voltage, while the same goes high in other case. An output terminal of the AND circuit 9a is connected to an input terminal of a buffer 10, an end of a delay resistor 23 and an end of another AND circuit 9b respectively. An output terminal of the buffer 10 is connected to an input terminal of an inverter 6.

An output terminal of the inverter 6 is connected to a base of the transistor 2 through a base resistor 4. The base resistor 4 is adapted to control a base current for the transistor 2. A collector of the transistor 2 is connected to the power supply terminal $V_{CC}$ of the semiconductor memory device 1, and an end of an input resistor 5, another end of which is grounded, is connected to an intermediate node therebetween. The input resistor 5 is adapted to determine input impedance for the semiconductor memory device 1 when the transistor 2 is cut off. The other end of the delay resistor 23 is connected to an input terminal of a buffer 25, while an end of a delay capacitor 24, another end of which is grounded, is connected to an intermediate node therebetween. An output terminal of the buffer 25 is connected to the other end of the AND circuit 9b. The delay resistor 23, the delay capacitor 24 and the buffer 25 define a delay circuit 22, which serves as delay means for delaying a rise time of the power supply/bus control signal VBC. The amount of delay of the delay circuit 22 is determined by a time constant of the delay capacitor 24.

The output terminal of the AND circuit 9b is connected to a gate terminal G of a three-state unidirectional buffer (hereinafter simply referred to as "buffer") 7 as well as to a gate terminal G of a three-state bidirectional buffer (hereinafter simply referred to as "buffer") 8. The AND circuit 9b is so provided that cut-off times for buses 13, 14 and 15, which are described later, are not delayed when the power supply/bus control signal VBC is converted to a low level.

The buffer 7 is interposed in an address bus 13, which is connected to the address terminal $T_A$ of the semiconductor memory device 1, and a control bus 14, which is connected to the control terminal $T_C$ of the semiconductor memory device 1. Address data ADD are inputted in the semiconductor memory device 1 through the address bus 13, while control data CTD are inputted in the semiconductor memory device 1 through the control bus 14. The buffer 7 connects/cuts off inputs of the address data ADD and the control data CTD in response to the power supply/bus control signal VBC.

The buffer 8 is interposed in a data bus 15, which is connected to the data input terminal $T_D$ of the semiconductor memory device 1. A data signal DTS is inputted in or outputted from the semiconductor memory device 1 through the data bus 15. The buffer 8 connects/cuts off input/output of the data signal DTS in response to the power supply/bus control signal VBC. A direction switching signal line 16 is connected to a direction switching terminal DIR of the buffer 8. The direction switching signal line 16 is supplied with a read/write signal R/W, to switch the direction of movement of the data signal DTS in the buffer 8 in response to read-/write operation of the semiconductor memory device 1.

Operation timing in the interface circuit 1 having the aforementioned structure is now described.

Figure 2:
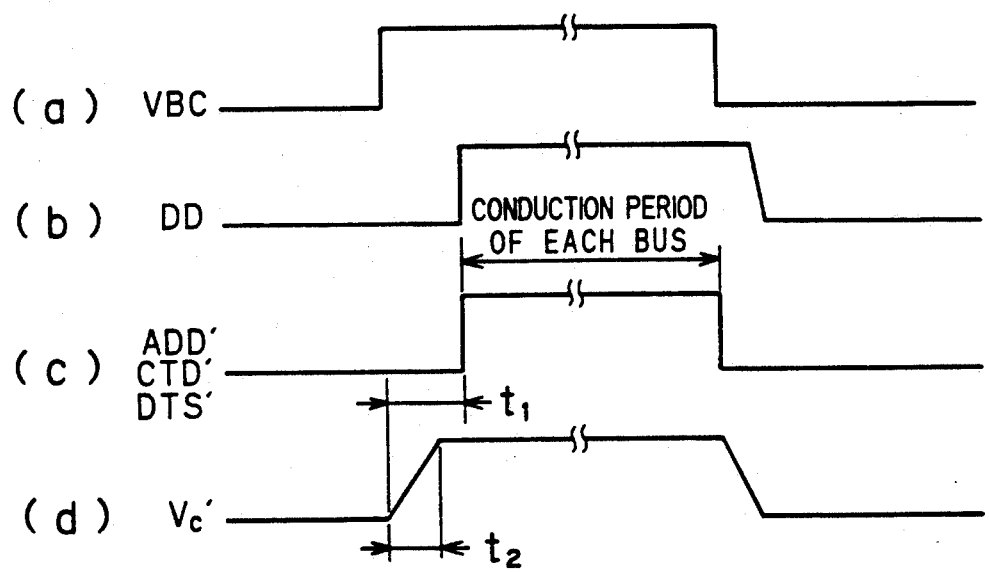
FIG. 2($a$–$d$) is an operation timing chart of the interface circuit for a semiconductor memory device according to the present invention.

FIG. 2 is an operating timing chart of the interface circuit 51 according to the present invention.

When the power supply/bus control signal VBC is brought into a low level and the power supply for the terminal device 50 is normally raised up in relation to the interface circuit 51 according to the present invention, a power supply instantaneous interruption detecting signal VTD goes high since the supply voltage $V_C$ exceeds a standard value. However, the output of the AND circuit 9a remains at a low level since the power supply/bus control signal VBC is at a low level. Therefore, the output of the inverter 6 is at a high level, and the transistor 2 remains in a nonconducting state. Namely, no supply voltage $V_C'$ is supplied to the power terminal $V_{CC}$. Since the output of the AND circuit 9a is at a low level, the output of the AND circuit 9b also goes low. Therefore, the buffers 7 and 8 maintain disable states. Thus, the terminal device 50 is inhibited from access to the semiconductor memory device 1 in such a state that the power supply of the terminal device 50 is raised up while the power supply/bus control signal VBC is brought into a low level.

In order to access the semiconductor device 1, the power supply/bus control signal VBC is raised up to a high level (FIG. 2(a)). Then, the output of the AND circuit 9a goes high, and the output of the inverter 6 goes low.

Therefore, a base current flows through the bleeder resistor 3, to allow conduction of the transistor 2. Thus, the supply voltage $V_C'$ is supplied to the power terminal $V_{CC}$. While the output of the AND circuit 9a is also supplied to the AND circuit 9b and the delay circuit 22, a gate control signal, which is outputted from the AND circuit 9b, goes high after a lapse of a delay time $t_1$, since an output DD of the delay circuit 22 goes high after a lapse of the delay time $t_1$. Thus, when the power supply/bus control signal is raised up to a high level, the transistor 2 first conducts to supply the supply voltage $V_C'$ to the power terminal $V_{CC}$, and then the buffers 7 and 8 conduct so that respective bus signals ADD', CTD' and DTS' are supplied to the respective terminals $T_A$, $T_C$ and $T_D$ of the semiconductor memory device 1. The delay time $t_1$ is set to be sufficiently longer than a time $t_2$ required for raising up the supply voltage $V_C'$, so that the buses 13, 14 and 15 conduct after the voltage supplied to the power terminal $V_{CC}$ reaches the supply voltage $V_C$.

When the power supply/bus control signal VBC is converted to a low level, on the other hand, the output of the AND circuit 9a goes low and hence the gate control signal also immediately goes low in response to this, whereby the buffers 7 and 8 are cut off. While the time required for converting the output DD of the delay circuit 22 to a low level is delayed in this case, the output of the AND circuit 9b also immediately goes low since a low level is immediately inputted in one input end of the AND circuit 9b, whereby the action of the delay circuit 22 is neglected. On the other hand, the output of the inverter 6 goes high when the output of the AND circuit 9a goes high, whereby the transistor 2 is cut off. As clearly understood from the above description, the time required for converting the output of the AND circuit 9b to a low level is identical to that required for converting the output of the inverter 6 to a high level. In the case, the transistor 2 is cut off after the buffers 7 and 8 are cut off, as hereinabove described.

Namely, when the power supply/bus control signal VBC is converted to a high level as shown in FIG. 2, the power input line 11 first conducts to supply the supply voltage $V_C'$ to the semiconductor memory device 1, and then the respective buses 13, 14 and 15 conduct in a delay by the time $t_1$ so that the respective bus signals ADD', CTD' and DTS' are supplied to the semiconductor memory device 1. When the power supply/bus control signal VBC is converted to a low level, on the other hand, the respective buses 13, 14 and 15 are first cut off and supply of the data ADD', CTD' and DTS' is stopped, and then the power input line 11 is cut off in a delay, to stop supply of the supply voltage $V_C'$.

According to the inventive interface circuit, operation performed when the power supply for the terminal device 50 is instantaneously interrupted in conducting states of the buses 13, 14 and 15 is absolutely identical to that performed when the power supply/bus control signal VBC is converted to a low level from the same state. Namely, the buses 13, 14 and 15 are first cut off by the buffer 8, and then the signal input line 11 is cut off by the transistor 2 in a delay.

According to the aforementioned interface circuit 51, the power supply and the input/output buses are connected/cut off in normal sequence with respect to the semiconductor memory device 1, whereby no latch-up phenomenon nor malfunction is caused in a semiconductor integrated circuit provided in the semiconductor memory device 1, and the same is prevented from deterioration and breakage.

Figure 3:
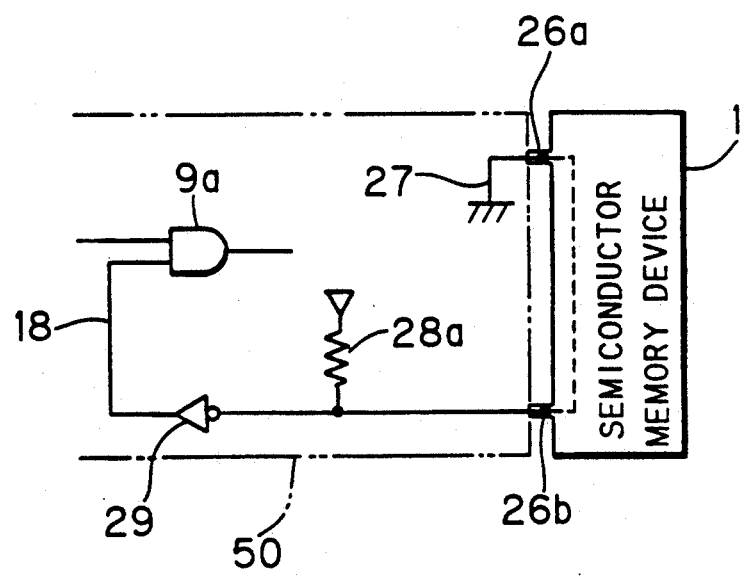
FIG. 3 is a circuit diagram showing exemplary connection of a control signal line.
Figure 4:
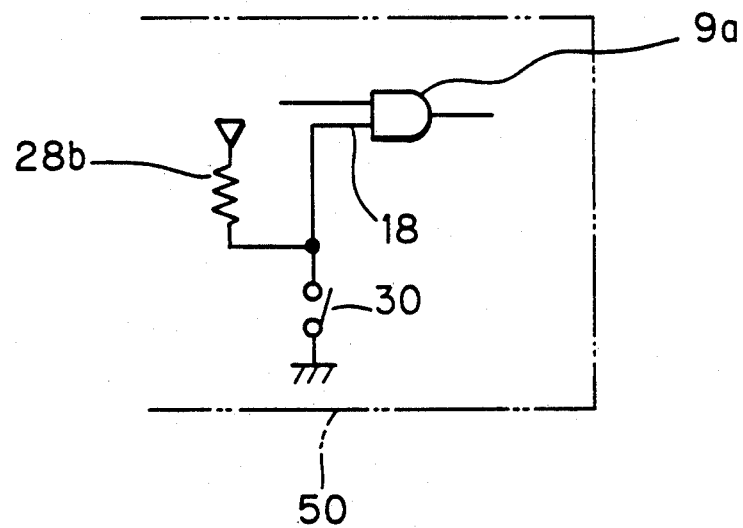
FIG. 4 is a circuit diagram showing another exemplary connection of the control signal line.
Figure 5:
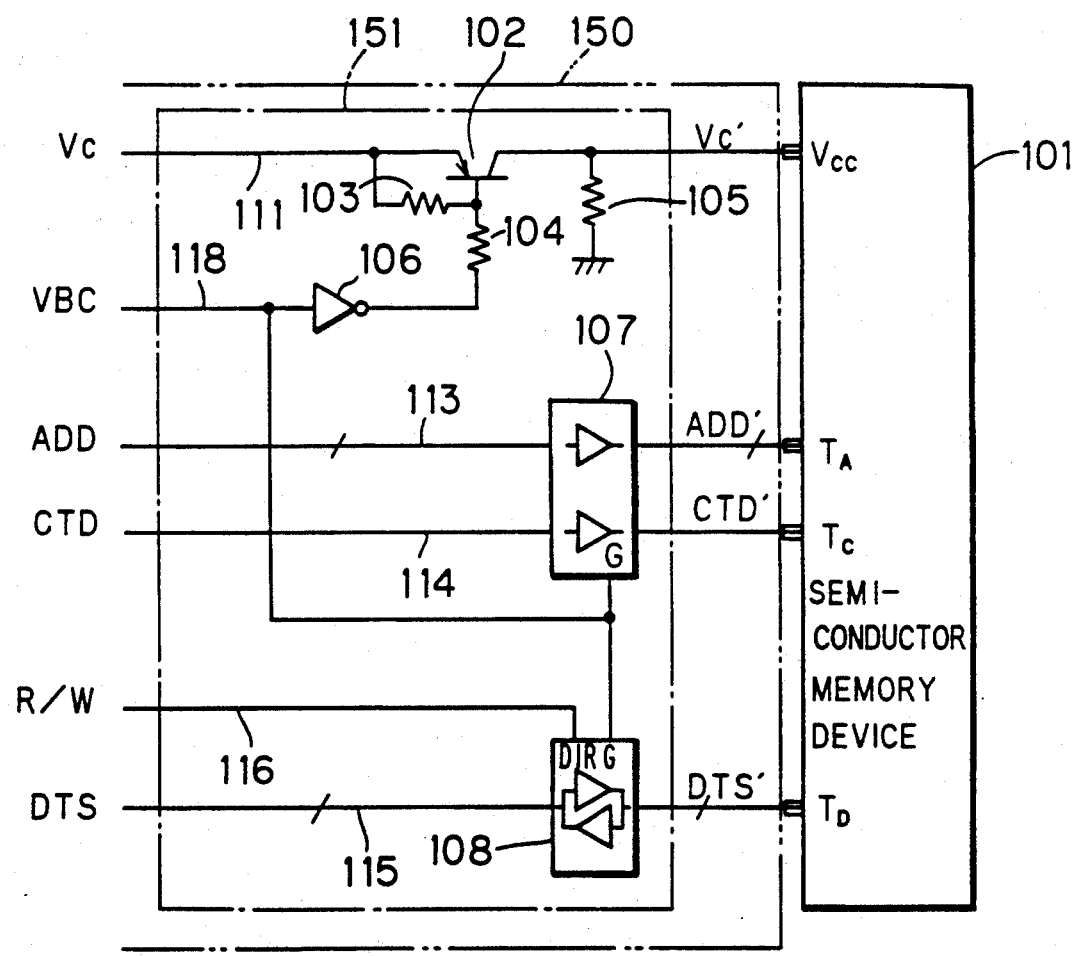
FIG. 5 is a circuit diagram showing the structure of a conventional interface circuit for a semiconductor memory device.
Figure 6:
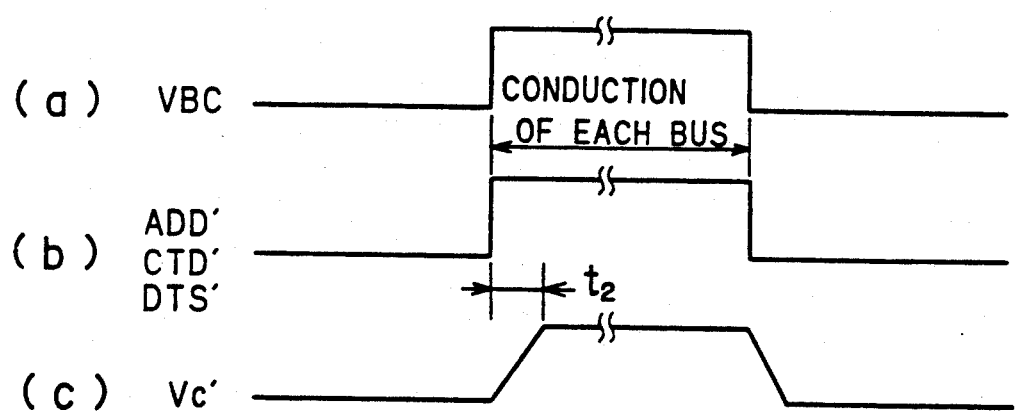
FIG. 6($a$–$c$) is an operation timing chart of the conventional interface circuit for a semiconductor memory device.

Exemplary connection of the control signal line 18 is now described. FIGS. 3 and 4 are circuit diagrams showing examples of connection of the control signal line 18. Referring to FIGS. 3 and 4, other structures are similar to that of FIG. 1.

Referring to FIG. 3, a semiconductor memory device 1 is connected with a terminal device 50, so that one terminal 26b of the shortest terminals 26a and 26b of the semiconductor memory device 1 is connected to the control signal line 18 while the other terminal 26a is connected to an earthing wire 27 of the terminal device 50. An end of a pullup resistor 28a, another end of which is connected to an input end for applying a high-level power supply/bus control signal VBC, is connected to an intermediate node between an input end of an AND circuit 9a and the terminal 26b. In the control signal line 18, an inverter 29 is interposed between a connecting end of the pullup resistor 28a and an input end of the AND circuit 9a. Thus, when the semiconductor memory device 1 is mounted on the terminal device 50 in a state supplied with a supply voltage $V_C$ and respective bus signals ADD, CTD and DTS, the AND circuit 9a inputs the power supply/bus control signal VBC and outputs a high-level signal following such mounting. Namely, also when the semiconductor memory device 1 is connected/detached in the aforementioned state, it is possible to connect/cut off the power supply and the input/output buses in the aforementioned normal sequence with respect to the semiconductor memory device 1. Since the shortest terminals 26a and 26b of the semiconductor memory device 1 are employed, the control signal line 18 and the earthing wire 27 are connected with each other at the last when the semiconductor memory device 1 is connected to the terminal device 50. When the semiconductor memory device 1 is detached from the terminal device 50, on the other hand, the control signal line 18 is cut off from the earthing wire 27 at the start.

FIG. 4 shows such an example that a switch 30 having a grounded end is connected to the control signal line 18. An end of a pullup resistor 28b, another end of which is connected to an input end of a power supply/bus control signal VBC, is connected to an intermediate node between the switch 30 and an input end of an AND circuit 9a. Thus, the power supply and input/output buses of a semiconductor memory device 1 can be connected/cut off by connecting/cutting off the switch 30. In general, the switch 30 is provided in an appropriate position (inlet port, for example) of a terminal device 50, so that the switch 30 is turned off when the semiconductor memory device 1 is mounted and the same is turned on when the semiconductor memory device 1 is detached. Thus, the power supply/bus control signal VBC is automatically supplied in response to attachment/detachment of the semiconductor memory device 1, so that the power supply and the input/output buses can be automatically connected/cut off.

Although the interface circuit for a semiconductor memory device is formed by a discrete circuit in the aforementioned embodiment, such an interface circuit may alternatively formed by a CMOS, a bipolar transistor, or a one-chip IC prepared by a process technique for BiCMOS or the like, as the matter of course.

While the invention has been shown and described in detail, the foregoing description is in all aspects illustrative and not restrictive. It is therefore understood that numerous modifications and variations can be devised without departing from the scope of the invention.

What is claimed is:

1. An interface circuit for a semiconductor memory device including a semiconductor integrated circuit, said interface circuit comprising:
   a control signal input end for receiving a control signal;
   a power input line for supplying a power supply voltage to said semiconductor memory device;
   power supply control means for connecting/disconnecting said power supply voltage in response to said control signal
   input/output buses connected to said semiconductor memory device;
   bus control means for connecting/disconnecting said input/output buses to said semiconductor memory device in response to a delay control signal and which operates at a higher speed than said power supply control means;
   a delay circuit for delaying said control signal from said input end a predetermined delay time, said predetermined delay time being a function of the difference in operating speed between said power supply control means and said bus control means; and
   delay control signal supply means for supplying said control signal, delayed by said delay circuit, to said bus control means as said delay control signal, wherein
   said power supply voltage is applied to said semiconductor memory device prior to inputting data on said input/output buses to said semiconductor memory device, preventing latch-up of said semiconductor integrated circuit.

2. An interface circuit for a semiconductor memory device in accordance with claim 1, wherein
   said delay control signal supply means includes an AND circuit for supplying the logical product of said control signal delayed by said delay means and non-delayed said control signal, being inputted through said input end, to said bus control means.

3. An interface circuit for a semiconductor memory device in accordance with claim 1, wherein
   said control signal is supplied in response to electrical connection of said interface circuit and said semiconductor memory device to said control signal input end.

4. An interface circuit for a semiconductor memory device in accordance with claim 1, wherein
   said interface circuit is provided in a terminal device, and
   said control signal is supplied in response to mechanical connection of said terminal device and said semiconductor memory device to said control signal input end.

5. An interface circuit for a semiconductor memory device in accordance with claim 1, further comprising an AND circuit for supplying said control signal to said power control means and said delay means when said control signal is supplied to said control signal input end and a supply voltage exceeds a prescribed level.

6. An interface circuit for a semiconductor memory device in accordance with claim 2, further comprising an AND circuit for supplying said control signal to said power control means and said delay means when said control signal is supplied to said control signal input end and a supply voltage exceeds a prescribed level.

7. An interface circuit for a semiconductor memory device in accordance with claim 6, wherein
   said control signal is supplied in response to electrical connection of said interface circuit and said semiconductor memory device to said control signal input end.

8. An interface circuit for a semiconductor memory device in accordance with claim 6, wherein
   said interface circuit is provided in a terminal device, and
   said control signal is supplied in response to mechanical connection of said terminal device and said semiconductor memory device to said control signal input end.

9. The interface circuit of claim 1, wherein
   said delay circuit comprises a resistor-capacitor circuit for controlling the predetermined delay time.

* * * * *